United States Patent
Bergler et al.

(10) Patent No.: US 11,796,567 B2
(45) Date of Patent: Oct. 24, 2023

(54) METHOD AND DEVICE FOR ELECTRICALLY CONTACTING COMPONENTS IN A SEMICONDUCTOR WAFER

(71) Applicant: OSRAM Opto Semiconductors GmbH, Regensburg (DE)

(72) Inventors: Michael Bergler, Etzenricht (DE); Roland Zeisel, Tegernheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 157 days.

(21) Appl. No.: 17/440,912

(22) PCT Filed: Mar. 9, 2020

(86) PCT No.: PCT/EP2020/056208
§ 371 (c)(1),
(2) Date: Sep. 20, 2021

(87) PCT Pub. No.: WO2020/187630
PCT Pub. Date: Sep. 24, 2020

(65) Prior Publication Data
US 2022/0163564 A1 May 26, 2022

(30) Foreign Application Priority Data
Mar. 20, 2019 (DE) .................... 10 2019 107 138.0

(51) Int. Cl.
*G01R 1/073* (2006.01)
*G01R 1/04* (2006.01)

(52) U.S. Cl.
CPC ......... *G01R 1/0735* (2013.01); *G01R 1/0491* (2013.01)

(58) Field of Classification Search
CPC .............. G01R 1/0735; G01R 1/0491; G01R 31/2886; G01R 31/2887; G01R 31/2889;
(Continued)

(56) References Cited

U.S. PATENT DOCUMENTS 4,471,298 A * 9/1984 Frohlich ............ G01R 1/06705
324/763.01
5,436,568 A   7/1995 Woith
(Continued)

FOREIGN PATENT DOCUMENTS

CN   106124958 A    11/2016
DE   103 24 450 A1   1/2005
(Continued)

OTHER PUBLICATIONS

Machine translation of CN 106124958 A (Year: 2016).*
(Continued)

*Primary Examiner* — Feba Pothen
*Assistant Examiner* — James Split
(74) *Attorney, Agent, or Firm* — Hauptman Ham, LLP

(57) ABSTRACT

A method for electrically contacting components in a semiconductor wafer includes providing a flexible board comprising a first main surface on which a plurality of conductor tracks are arranged, positioning the board with respect to a semiconductor wafer such that the first main surface of the board faces the semiconductor wafer, the board is bent and pressed onto the semiconductor wafer in such a way that contact elements of a plurality of components arranged in a row in the semiconductor wafer come into contact with the conductor tracks, and electrical signals are applied to the components through the conductor tracks.

11 Claims, 3 Drawing Sheets

Figure 1:
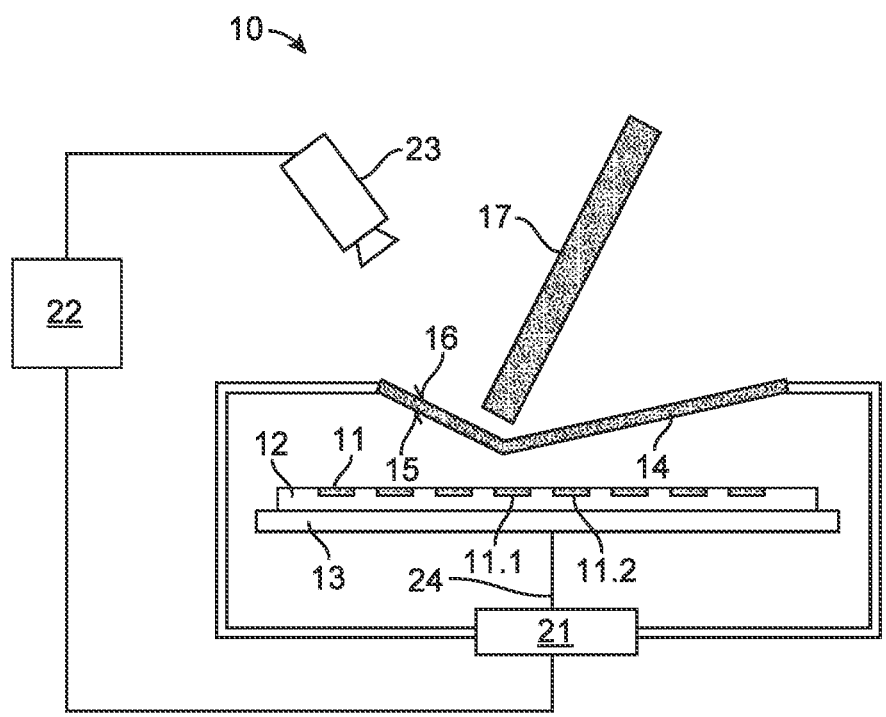

(58) Field of Classification Search
CPC .. G01R 1/07307; G01R 1/073; G01R 1/0408; G01R 1/06; G01R 1/067; G01R 1/06716
See application file for complete search history.

(56) References Cited

U.S. PATENT DOCUMENTS

| | | | | |
|---|---|---|---|---|
| 5,583,445 | A * | 12/1996 | Mullen | G01R 1/0735 324/755.09 |
| 6,259,264 | B1 * | 7/2001 | Freund | G01R 31/2635 324/750.08 |
| 6,448,805 | B1 * | 9/2002 | Heald | H01S 5/0201 324/750.19 |
| 7,724,030 | B1 * | 5/2010 | McNeil | H03K 19/17744 712/201 |
| 8,624,614 | B2 * | 1/2014 | Omori | H01S 5/0021 324/750.05 |
| 10,461,000 | B2 * | 10/2019 | Seddon | H01L 21/6836 |

FOREIGN PATENT DOCUMENTS

| | | |
|---|---|---|
| JP | H3-48171 A | 3/1991 |
| WO | 2018/149838 A1 | 8/2018 |

OTHER PUBLICATIONS

Machine translation of JP H03-48171 A (Year: 1991).*
International Search Report issued for corresponding International Patent Application No. PCT/EP2020/056208 dated Jun. 18, 2020, along with an English translation.
Written Opinion issued for corresponding International Patent Application No. PCT/EP2020/056208 dated Jun. 18, 2020.

* cited by examiner

METHOD AND DEVICE FOR ELECTRICALLY CONTACTING COMPONENTS IN A SEMICONDUCTOR WAFER

CROSS REFERENCE TO RELATED APPLICATION

This application is a National Stage of International Application No. PCT/EP2020/056208, filed on Mar. 9, 2020, which designates the United States and was published in Europe, and which claims priority to German Patent Application No. 10 2019 107 138.0, filed on Mar. 20, 2019, in the German Patent Office. Both of the aforementioned applications are hereby incorporated by reference in their entireties.

The present invention relates to a method and device for electrically contacting devices integrated in a semiconductor wafer.

With conventional methods, semiconductor wafers, which contain optoelectronic components in particular, can only be measured with a comparatively high expenditure of time.

The present invention is based, among other things, on the object of providing a method with which components integrated in a semiconductor wafer can be electrically contacted in a cost-effective manner and with reduced expenditure of time, in order to be able to test the function of the individual components. Furthermore, a corresponding device for electrically contacting components in a semiconductor wafer is to be created.

An object of the invention is solved by a method having the features of claim 1. An object of the invention is further solved by a device having the features of independent claim 12. Preferred embodiments and further developments of the invention are given in the dependent claims.

A method according to one embodiment is used for electrically contacting components integrated in a semiconductor wafer. The components are not separated during electrically contacting, but are still in the wafer compound. The semiconductor wafer is the wafer on which the components are formed. The components are arranged in the semiconductor wafer, for example, in a matrix of rows and columns. The semiconductor wafer includes semiconductor material, but need not consist exclusively of semiconductor material, but may also include, for example, metals and/or insulators. After carrying out the method described in the present application, the components can be separated to form semiconductor chips, for example by means of sawing.

The method provides a flexible board comprising a first main surface on which a plurality of conductor tracks are arranged.

The board is arranged with respect to the semiconductor wafer such that the first main surface of the board, on which the conductor tracks are located, faces the semiconductor wafer. For example, the board is arranged above the semiconductor wafer.

Furthermore, the board is bent and pressed onto the semiconductor wafer in such a way that contact elements of several components arranged in a row in the semiconductor wafer come into contact with the conductor tracks. The contact elements can be electrically contacted by the conductor tracks, which makes it possible to apply electrical signals to the components.

By bending the board, the board contacts the semiconductor wafer along a line so that only the contact elements from those components that are located in the same row or line of the semiconductor wafer come into contact with the conductor tracks at the same time.

Furthermore, electrical signals can be measured via the conductor tracks, in particular in response to the electrical signals applied to the components. This makes it possible to check the function of the components. For example, a current-voltage characteristic of the respective components can be recorded. Alternatively, only one or more point(s) on the current-voltage characteristic can be recorded. Since the components arranged in a row of the semiconductor wafer are contacted and tested at the same time, the verification of the components can be performed relatively quickly and with only a small amount of effort. Each of the conductor tracks is connected to a corresponding test unit.

Compared to other measurement methods, the measurement time is reduced to a few seconds per semiconductor wafer. Furthermore, the method described here does not cause needle marks on the components, which are often considered a problem during further processing.

The flexible board can be, for example, a printed circuit board (PCB), circuit card, circuit board or printed circuit, which has a suitable flexibility. A printed circuit board comprises a body of electrically insulating material with conductor tracks adhered thereto. Fiber-reinforced plastic may be used as the electrically insulating material. For example, glass fibers may be embedded in a polyimide or an epoxy or silicone resin. The desired pliability of the printed circuit board can be brought about in particular by a correspondingly low thickness of the printed circuit board. The conductor tracks can be etched from a thin layer of copper.

The conductor tracks can extend essentially straight or linearly and be aligned parallel to one another. The respective width of the conductor tracks can be in the range of 30 to 200 µm. Such a width allows contact elements or bond pads of the components to be contacted, which typically have widths in the range of 60 to 140 µm.

The board can be bent with the aid of a tool. The tool, for example a squeegee, which in particular has a blade geometry, can be pressed onto a second main surface of the board opposite the first main surface in such a way that the board is bent in the desired manner. The board may be attached at two opposite ends to a suitable holder. The tool makes it possible in a simple manner to bend the board in such a way that the conductor tracks arranged on the first main surface of the board contact the contact elements of exactly one line of the semiconductor wafer.

In order to successively contact all or a certain part of the components of the semiconductor wafer, the tool can be moved along the board. As a result, contact elements of different components integrated in the semiconductor wafer come into contact with the conductor tracks one after the other. The components of different rows of the semiconductor wafer can be tested one after the other. In particular, the tool moves in a direction parallel to the conductor tracks or perpendicular to the component rows of the semiconductor wafer.

Alternatively, it would also be conceivable to design the bent board in a fixed manner and to move the semiconductor wafer with respect to the board in order to be able to test the components line by line.

According to one embodiment, the components each comprise at least one first contact element on a first main surface of the semiconductor wafer and at least one second contact element on a second main surface of the semiconductor wafer opposite the first main surface. The first and second contact elements may be, for example, anode and cathode terminals. One conductor track is provided on the board for each component, which contacts the first contact element of the respective component. The second contact elements of the components can be connected to one or more suitable stationary contact surfaces so that closed circuits can be formed.

According to an alternative embodiment, the optoelectronic components comprise a so-called flip-chip configuration, i.e. all electrical contact elements are arranged on the first main surface of the semiconductor wafer facing the board. In the event that a first and a second contact element of each component are to be contacted, two adjacent conductor tracks can be provided on the board per component, which come into contact with the first and the second contact element of the respective component, respectively.

The components may be optoelectronic components configured to emit light.

The optoelectronic components can, for example, be light-emitting diodes (LEDs) or organic light-emitting diodes (OLEDs). In various embodiments, the optoelectronic components can be part of an integrated circuit.

The light emitted by the optoelectronic components can be, for example, light in the visible range, ultraviolet (UV) light, and/or infrared (IR) light.

By applying electrical signals, in particular a current, to the optoelectronic components, the optoelectronic components can be excited to generate light. To check the function of the optoelectronic components, the light emitted by them can be measured with the aid of a sensor. For example, the sensor can detect the light emitted by the components of one row of the semiconductor wafer. Further, this measurement may be carried out together with the current-voltage measurement of the relevant row described above. For example, the sensor may be a scanner or a camera.

To ensure that the sensor reliably detects the light emitted by the components to be inspected, the sensor can be moved along the board together with the tool. This ensures that the sensor is at a substantially constant distance from the components to be inspected, so that comparable measurement results are obtained.

The sensor can be a hyperspectral sensor, for example a hyperspectral line scanner. A hyperspectral sensor is a 2D camera in which one dimension does the location mapping, in this case the mapping of the line in which the optoelectronic components are tested. The second dimension is used to spectrally split the light of a location of the first dimension.

The light detected by the sensor can be evaluated to check the function of the optoelectronic components.

Since the board with the conductor tracks may be located between the components and the sensor during the execution of the measurements, it may be provided that the board and/or the conductor tracks are at least partially transparent. In particular, the board and/or the conductor tracks may be partially transparent at least for the wavelengths of the light emitted by the optoelectronic components, i.e. the board and/or the conductor tracks do not completely absorb the light of these wavelengths. Of course, the board and/or the conductor tracks can also be completely transparent for the wavelengths in question.

To achieve the desired transparency, the board body can, for example, be made of a flexible and sufficiently transparent plastic. The conductor tracks can, for example, be made of a transparent, electrically conductive oxide (TCO), such as indium tin oxide (ITO).

To test the components, a current, in particular a constant current, can be applied to one end or end section of each of the conductor tracks. A voltmeter, i.e. a voltage measuring device, can be connected to each of the other ends or end sections of the conductor tracks, which measures the electrical potential applied there against a reference potential. In this geometry, it is possible to measure the voltage at the component independently of the lead resistance of the current source to the component.

For all components to be checked, a point on the current-voltage characteristic of the respective component can first be recorded by setting a specific constant current value. The measurement can then be repeated with other constant current values to determine further points on the current-voltage characteristics of the components.

The measured current-voltage values can possibly be used together with the data recorded by the sensor described above to check the function of the optoelectronic components.

A device according to one embodiment is for electrically contacting components in a semiconductor wafer. The device comprises a holder configured to hold a semiconductor wafer, and a flexible board comprising a first main surface on which a plurality of conductor tracks are arranged. Further, the device comprises a unit for generating electrical signals, such as one or more current sources. The board is arranged with respect to the semiconductor wafer such that the first main surface of the board faces the semiconductor wafer. Further, the board is bent and pressed onto the semiconductor wafer such that contact elements of a plurality of components arranged in a row in the semiconductor wafer come into contact with the conductor tracks. The unit for generating electrical signals applies electrical signals to the components through the conductor tracks, in particular the unit applies a respective current to the components.

The device for electrically contacting components in a semiconductor wafer may have the embodiments of the method for electrically contacting components in a semiconductor wafer described above.

The device may comprise a tool that is pressed onto a second main surface of the wafer opposite the first main surface to bend and press the board against the semiconductor wafer.

The tool can be moved along the board so that contact elements of various components integrated in the semiconductor wafer can come into contact with the conductor tracks one after the other and be measured accordingly.

The unit for generating electrical signals can feed a current into one end of one or more conductor tracks. A unit for measuring an electrical potential or voltage may be connected to the other end of the respective conductor track.

Furthermore, the device can comprise an evaluation unit. The evaluation unit can, for example, use the measured electrical potentials or voltages to check the functionality of the components.

Figure 2:
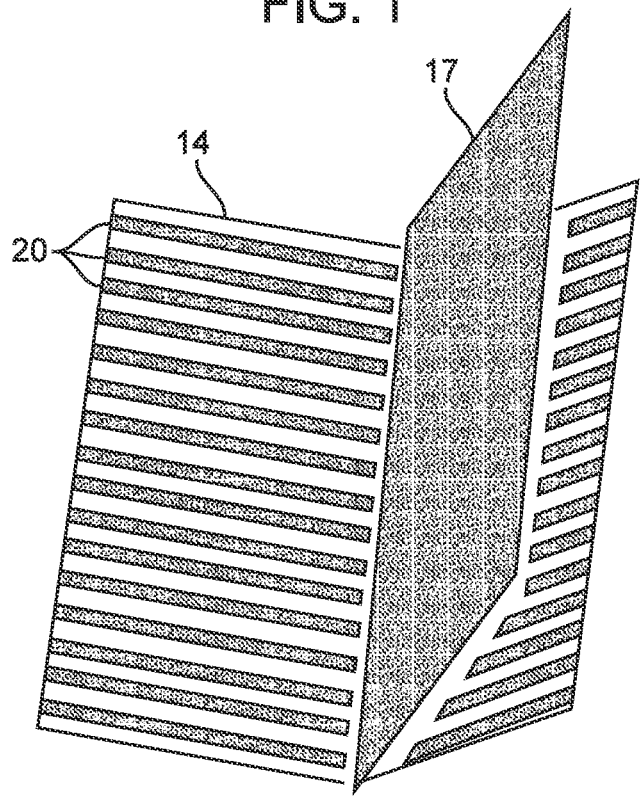
Figure 3:
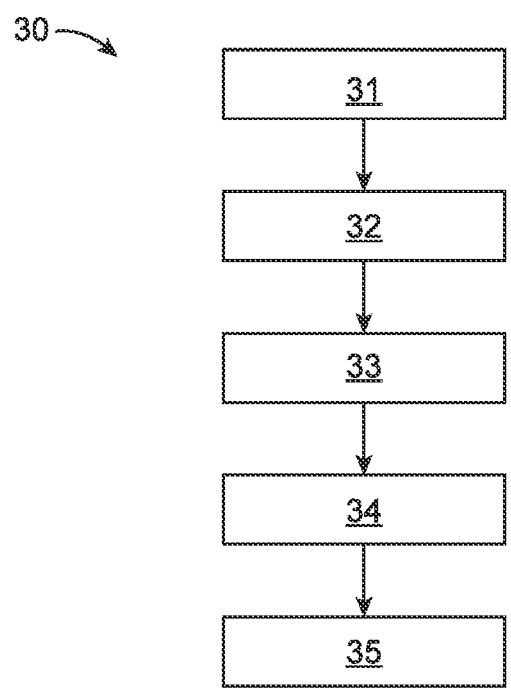
Figure 4:
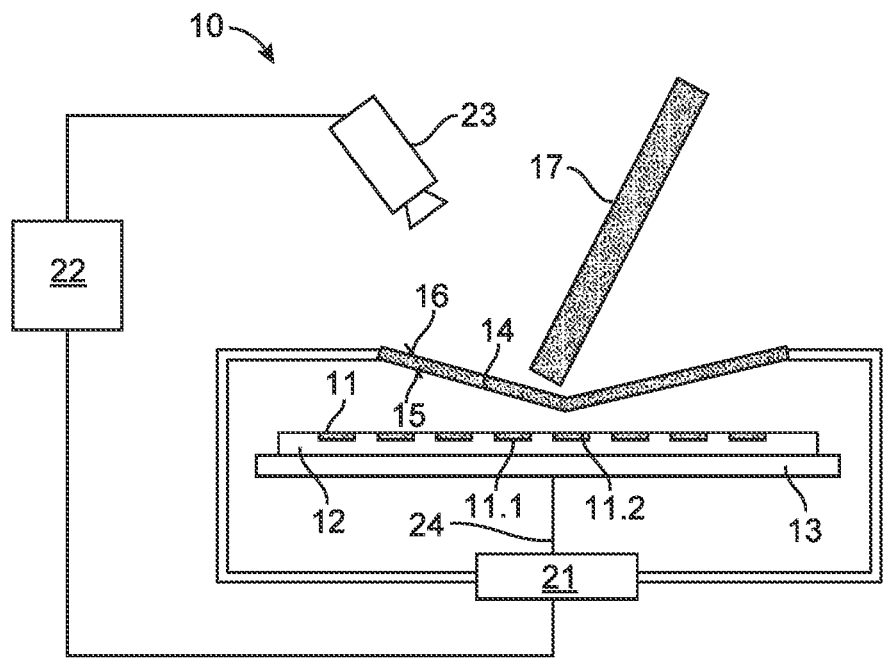
Figure 5:
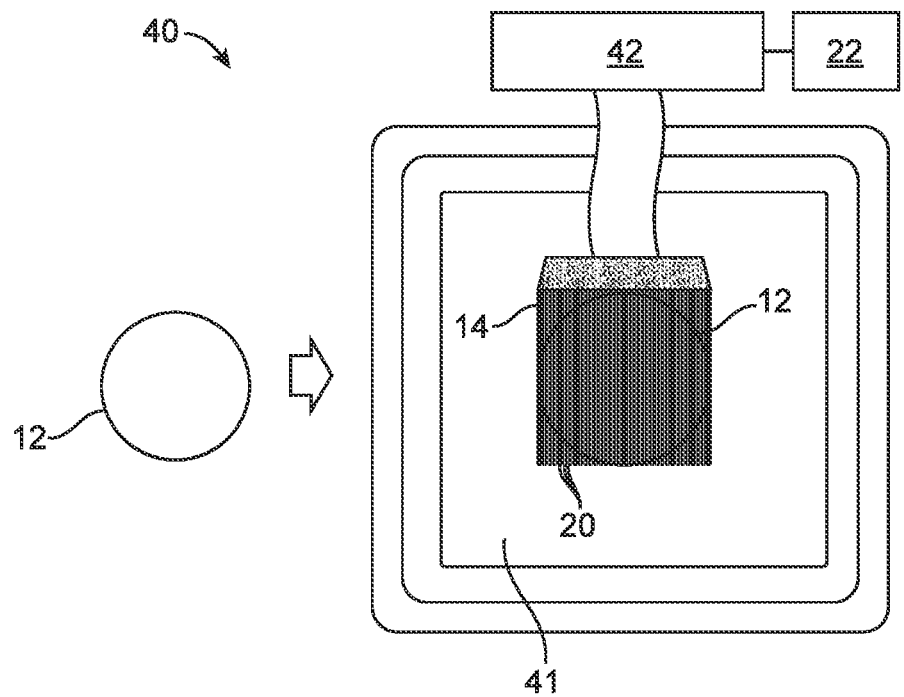

In the following, embodiments of the invention are explained in more detail with reference to the accompanying drawings. In these schematically show:

FIG. 1 an illustration of an embodiment of a device for electrically contacting components in a semiconductor wafer;

FIG. 2 a perspective view of the device of FIG. 1;

FIG. 3 an illustration of an embodiment of a method for electrically contacting components in a semiconductor wafer;

FIG. 4 an illustration of the device of FIG. 1 during operation of the device; and FIG. 5 an illustration of a further embodiment of a device for electrically contacting components in a semiconductor wafer.

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

FIG. 1 shows the schematic structure of a device 10 used for electrically contacting and checking components 11 integrated in a semiconductor wafer 12.

The device 10 comprises a holder 13, which holds the semiconductor wafer 12, and a flexible board 14, for example a flexible printed circuit board, comprising a first main surface 15 and a second main surface 16 opposite the first main surface 15. The board 14 is arranged with respect to the semiconductor wafer 12 in such a way that the first main surface 15 of the board 14 faces the semiconductor wafer 12. A tool 17, for example a squeegee, which in particular has a blade geometry, is pressed onto the second main surface 16, as a result of which the bending of the originally, for example, flat board 14 in the direction of the semiconductor wafer 12, as shown in FIG. 1, results and contact is thus made between the main surface 15 and the contact elements of the semiconductor wafer 12.

FIG. 2 shows a perspective view of the board 14 as well as the tool 17 in a top view. In the present embodiment, the board body of the board 14 is made of a substantially transparent material. A plurality of conductor tracks 20 extending parallel to each other are arranged on the first main surface 15 of the board 14, which can be seen in FIG. 2 through the transparent material of the board body.

The force applied to the board 14 by the tool 17 causes the conductor tracks 20 to come into contact with contact elements of a plurality of components 11 integrated into the semiconductor wafer 12, which are not shown in the figures.

The semiconductor wafer 12 and the board 14 are oriented with respect to each other so that the conductor tracks 20 at any one time come into contact only with the contact elements of components 11 arranged in the same row of the semiconductor wafer 12. In FIG. 1, the conductor tracks 20 are in contact with the contact elements of the component 11.1 shown in FIG. 1 and of other components 11 arranged in the same row. The row extends perpendicular to the drawing plane.

The device 10 further comprises a measuring unit 21 electrically connected to the two respective ends or end portions of the conductor tracks 20. The measuring unit 21 applies a predetermined current into one end of a respective conductor track 20. The applied current flows through the component 11 in contact with the conductor track 20 and through a terminal of the holder 13, which is in contact with the bottom side of the semiconductor wafer 12 and a contact element of the component 11 located there, to the measuring unit 21, which is electrically connected to the holder 13 via a connection 24. A voltage measuring device integrated in the measuring unit 21 is connected to the other end of the relevant conductor track, which measures the voltage dropping across the component 11.

The measuring unit 21 is connected to an evaluation unit 22, to which the voltage values recorded by the measuring unit 21 are transmitted.

The components 11 are optoelectronic components that emit light of a specific wavelength or range of wavelengths when the current generated by the measuring unit 21 is applied to them.

A sensor 23, in particular a hyperspectral sensor, measures the intensity and spectrum emitted by the components 11 and transmits the corresponding measured values to the evaluation unit 22.

FIG. 3 shows the process steps of a method 30 carried out with the device 10 for electrically contacting the components 11 in the semiconductor wafer 12.

In step 31, the semiconductor wafer 12 is provided and received in the holder 13.

In step 32, the tool 17 is pressed onto the second main surface 16 of the flexible board 14 to bring the conductor tracks 20 arranged on the first main surface 15 of the board 14 into contact with a row of components 11.

In step 33, the measuring unit 21 and the sensor 23 are used to record the measured values described above and transmit them to the evaluation unit 22.

In step 34, the tool 17 is moved further so that the components 11 of the next row of the semiconductor wafer 12 are now in contact with the conductor tracks 20. This is shown by way of example in FIG. 4. While in FIG. 1 the conductor tracks 20 contact the component 11.1 as well as the other components arranged in the same row, in FIG. 4 the tool 17 has been moved by one row so that now the neighboring component 11.2 as well as the other components arranged in the same row are in contact with the conductor tracks 20.

In step 35, the measuring unit 21 and the sensor 23 record the measured values for the now contacted components 11 and transmit them to the evaluation unit 22.

In the measurements described, the sensor 23 is moved together with the tool 17 so that the sensor 23 is always the same distance from the components 11 to be examined.

The described procedure can be continued until all the components 11 of the semiconductor wafer 12 to be checked have been tested. The evaluation unit 22 can identify those components 11 whose function is impaired.

FIG. 5 shows the schematic structure of a device 40 for electrically contacting and checking components 11. In this embodiment, the flexible board 14 with the line structure consisting of the conductor tracks 20 is clamped in a screen printing frame 41. The screen printing frame 42 is integrated into an automatic stencil printing machine, which is not shown. The semiconductor wafer 12 is arranged below the screen printing frame 41. The electrical data are recorded by a data acquisition card 42 and transmitted to the evaluation unit 22, which is designed as a computer.

The squeegee, which is not shown in FIG. 5, presses the board 14 in the direction of the semiconductor wafer 12 in order to be able to contact individual components 11. The screen printing frame 41 enables the exact and, in particular, automatic alignment of the conductor tracks 20 to the components 11. The number of conductor tracks 20 can correspond to the maximum number of components 11 of a line of the semiconductor wafer 12. Electrodes coupled to the conductor tracks 20 are connected to the inputs of the data acquisition board 42 in such a way that a 3-point measurement is possible.

The contacting time per component 11 during the execution of the measurements depends on the size of an individual component 11 as well as the squeegee speed and is in the range of a few milliseconds. The pressure of the squeegee on the flexible board 14 as well as the speed at which the squeegee moves over the flexible board 14 can be adjusted. In parallel with the squeegee, a hyperspectral line scan camera moves over the semiconductor wafer 12 and measures intensity and spectrum for one line at a time. From this, the evaluation unit 22 can determine the optical data for each component 11.

LIST OF REFERENCE SIGNS 10 device
11 component
11.1 component
11.2 component
12 semiconductor wafer
13 holder
14 board
15 first main surface
16 second main surface
17 tool
20 conductor track
21 measuring unit
22 evaluation unit
23 sensor
24 connection
30 method
31 Step
32 Step
33 Step
34 Step
35 Step
40 device
41 screen printing frame
42 data acquisition map

The invention claimed is:

1. A method for electrically contacting components in a semiconductor wafer, wherein
   a flexible board is provided comprising a first main surface on which a plurality of conductor tracks are arranged,
   the board is arranged with respect to a semiconductor wafer such that the first main surface of the board faces the semiconductor wafer,
   the board is bent and pressed onto the semiconductor wafer in such a way that contact elements of a plurality of components arranged in a row in the semiconductor wafer come into physical contact with the conductor tracks,
   electrical signals are applied to the components through the conductor tracks,
   the board is bent by means of a tool pressed on a second main surface of the board opposite to the first main surface, and
   the tool is moved along the board so that contact elements of different components integrated in the semiconductor wafer successively come into physical contact with the conductor tracks.

2. The method according to claim 1, wherein the components each comprise a first contact element on a first main surface of the semiconductor wafer and a second contact element on a second main surface of the semiconductor wafer opposite the first main surface, wherein one conductor track per component comes into contact with the first contact element.

3. The method according to claim 1, wherein the components each comprise a first contact element and a second contact element on a first main surface of the semiconductor wafer, wherein per component one conductor track comes into contact with the first contact element and a further conductor track comes into contact with the second contact element respectively.

4. The method according to claim 1, wherein the components are optoelectronic components configured to emit light.

5. The method according to claim 4, wherein a sensor detects at least a portion of the light emitted by the optoelectronic components.

6. The method according to claim 5, wherein the sensor is moved along the board together with the tool.

7. The method according to claim 5, wherein the sensor is a hyperspectral sensor.

8. The method according to claim 1, wherein the board and/or the conductor tracks are at least partially transparent.

9. The method according to claim 1, wherein a current is applied to a first end of one of the conductor tracks and an electrical potential is measured at a second end of the one of the conductor tracks to which the current is applied opposite to the first end.

10. A device for electrically contacting components in a semiconductor wafer, comprising:
    a holder configured to hold a semiconductor wafer,
    a flexible board comprising a first main surface on which a plurality of conductor tracks are arranged, and
    a unit for generating electrical signals,
    wherein the board is arranged with respect to the semiconductor wafer such that the first main surface of the board faces the semiconductor wafer,
    wherein the board is bent and configured to be pressed onto a semiconductor wafer such that contact elements of a plurality of components arranged in a row in the semiconductor wafer come into physical contact with the conductor tracks,
    wherein the electrical signal generating unit applies electrical signals to the components through the conductor tracks,
    wherein the device comprises a tool pressed on a second main surface of the board opposite the first main surface to bend the board, and
    wherein the tool is moved along the board so that contact elements of different components integrated in the semiconductor wafer successively come into physical contact with the conductor tracks.

11. The device according to claim 10, wherein the electrical signal generation unit applies a current to a first end of one of the conductor tracks and a unit for measuring an electrical potential is connected to a second end of the one of the conductor tracks to which the current is applied opposite to the first end.

* * * * *